(12) United States Patent
Dreps et al.

(10) Patent No.: US 7,242,249 B2
(45) Date of Patent: Jul. 10, 2007

(54) PEAKING TRANSMISSION LINE RECEIVER FOR LOGIC SIGNALS

(75) Inventors: Daniel M. Dreps, Georgetown, TX (US); Bao G. Truong, Austin, TX (US); Glen A. Wiedemeier, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 147 days.

(21) Appl. No.: 11/055,806

(22) Filed: Feb. 11, 2005

(65) Prior Publication Data

US 2006/0181348 A1    Aug. 17, 2006

(51) Int. Cl.
*H03F 3/45*     (2006.01)
*H03K 19/094*   (2006.01)

(52) U.S. Cl. .......................................... 330/254; 326/86

(58) Field of Classification Search .................... None
See application file for complete search history.

(56) References Cited

U.S. PATENT DOCUMENTS

| | | | | |
|---|---|---|---|---|
| 4,795,916 A | * | 1/1989 | Liron | ........................... 326/89 |
| 6,160,417 A | * | 12/2000 | Taguchi | ........................ 326/30 |
| 6,448,815 B1 | * | 9/2002 | Talbot et al. | ................... 326/86 |
| 6,665,624 B2 | * | 12/2003 | Simon et al. | .................. 702/89 |
| 6,693,463 B2 | * | 2/2004 | Mateman | ..................... 326/127 |
| 6,747,483 B2 | * | 6/2004 | To et al. | ........................ 326/86 |
| 6,771,124 B1 | * | 8/2004 | Ezell | ........................... 330/129 |

* cited by examiner

*Primary Examiner*—Robert Pascal
*Assistant Examiner*—Krista Flanagan
(74) *Attorney, Agent, or Firm*—Winstead PC

(57) ABSTRACT

A receiver circuit is configured as a frequency compensated differential amplifier having one input coupled to the output of a transmission line to receive a transmitted signal and the second input coupled to a reference voltage. The differential amplifier has a high frequency gain equivalent to the gain of an uncompensated differential stage for the transmitted signal. The compensated differential amplifier has an attenuated low frequency gain for signal frequencies substantially lower than the high frequency and a transitional gain for frequencies between the low and high frequencies. A compensated stage provides the portion of the signal with a compensated response and an uncompensated stage provides the portion of the amplified signal that is uncompensated. Bias control signals determine how much of the output signal is from the compensated and uncompensated stages as a means for customizing response from transmission lines with varying losses.

20 Claims, 7 Drawing Sheets

PEAKING TRANSMISSION LINE RECEIVER FOR LOGIC SIGNALS

TECHNICAL FIELD

The present invention relates in general to board level transmission line drivers and receivers, and in particular, to receiver circuits for shaping receiver transmission line signals.

BACKGROUND INFORMATION

Digital computer systems have a history of continually increasing the speed of the processors used in the system. As computer systems have migrated towards multiprocessor systems, sharing information between processors and memory systems has also generated a requirement for increased speed for the off-chip communication networks. Designers usually have more control over on-chip communication paths than for off-chip communication paths. Off-chip communication paths are longer, have higher noise, impedance mismatches, and have more discontinuities than on-chip communication paths. Since off-chip communication paths are of lower impedance, they require more current and thus more power to drive.

When using inter-chip high-speed signaling, noise and coupling between signal lines (cross talk) affects signal quality. One way to alleviate the detrimental effects of noise and coupling is through the use of differential signaling. Differential signaling comprises sending a signal and its compliment to a differential receiver. In this manner, noise and coupling affect both the signal and the compliment equally. The differential receiver only senses the difference between the signal and its compliment as the noise and coupling represent common mode signals. Therefore, differential signaling is resistant to the effects that noise and cross talk have on signal quality. On the negative side, differential signaling increases pin count by a factor of two for each data line. The next best thing to differential signaling is pseudo-differential signaling. Pseudo-differential signaling comprises comparing a data signal to a reference voltage using a differential receiver or comparator.

When high speed data is transmitted between chips, the signal lines are characterized by their transmission line parameters. High speed signals are subject to reflections if the transmission lines are not terminated in an impedance that matches the transmission line characteristic impedance. Reflections may propagate back and forth between driver and receiver and reduce the margins when detecting signals at the receiver. Some form of termination is therefore usually required for all high-speed signals to control overshoot, undershoot, and increase signal quality. Typically, a Thevenin's resistance (equivalent resistance of the Thevenin's network equals characteristic impedance of transmission line) is used to terminate data lines allowing the use of higher valued resistors. Additionally, the Thevenin's network is used to establish a bias voltage between the power supply rails. In this configuration, the data signals will then swing around this Thevenin's equivalent bias voltage. When this method is used to terminate data signal lines, a reference voltage is necessary to bias a differential receiver that operates as a pseudo-differential receiver to detect data signals in the presence of noise and cross talk.

The logic levels of driver side signals are determined by the positive and ground voltage potentials of the driver power supply. If the driver power supply has voltage variations that are unregulated, then the logic one and logic zero levels of the driver side signals will undergo similar variations. If the receiver is substantially remote from the driver such that its power supply voltage may undergo different variations from the driver side power supply, then additional variations will be added to any signal received in a receiver side terminator (e.g., Thevenin's network). These power supply variations will reduce noise margins if the reference has variations different from those on the received signals caused by the driver and receiver side power supply variations.

As the frequency of transmitted signals increases, the signal losses resulting from the signal propagating over a lossy transmission line also increase. These losses cause the high frequency content of the signal to attenuates and phase shifts relative to its lower frequency content. This results in receiver side signal distortion. This is especially true for signal transitions which may be slowed and distorted. Signal detection using pseudo differential signal generates an output by comparing a signal that arrives at a receiver to a reference voltage. As the high frequency content of a signal degrades, the signal transitions through the reference level more slowly and therefore the resulting detected signal has more uncertainty regarding timing of the signal transitions.

Signal quality may be increased by compensating for high frequency losses. It is well known that any repetitive signal or pattern may be decomposed in to its various Fourier frequency components. Such a decomposition of a generated signal and a signal received over a transmission line would show that high frequency content is attenuated more that lower frequency content. To compensate for these effects, one may decrease the low frequency content, boost the high frequency content or do both. Frequency compensation may be incorporated at the source or driver side, within the transmission network, or at the receiver side. Simply boosting the high frequency content may also increase the high frequency noise.

When using pseudo differential signaling to reduce pin count, it may be also desirable to generate a reference voltage for each data pin for improved receiver side power supply tracking. In this case, it would also be beneficial to apply controllable frequency compensation at the receiver side where each of the data nets may have different propagation losses. Data nets where the losses are not significant may suffer signal degradation if frequency compensation is added.

There is, therefore, a need for circuitry implementing receiver side high controllable frequency compensation for pseudo differential receivers.

SUMMARY OF THE INVENTION

A pseudo differential receiver comprises a differential stage where a signal received over a transmission line is applied to one input and a reference voltage applied to the other input. The reference voltage may be generated at the receiver side or from the driver side. If the reference is generated at the driver side, a single reference source would driver multiple receiver inputs to conserve pin count. If the reference is generated on the receiver side, each data input may generate its own reference for better power supply tracking. In either case, common mode noise signals are reduced by the common mode rejection of the differential stage.

Differential voltage gain stages may be configured as common source FET stages or common emitter bipolar stages. As the current in each half of the differential stage is varied in response to an input signal a corresponding voltage change is generated across a load resistor in series with the drain or collector. The amount of current change that results from a corresponding input voltage change depends on the dynamic impedance of the differential stage. Therefore, the voltage gain of the differential stage is directly related to the bias current of the stage. The higher the bias current the lower the dynamic impedance of the differential stage and thus the higher its voltage gain. Typically a differential stage is biased with a current source with a current level I wherein each half of the differential stage is biased at a current level of I/2. For a received differential signal, one input of the differential stage increases as the other decreases generating corresponding voltage changes across the load resistors. In the pseudo differential stage, only one signal input changes while the other remains at the potential of the reference voltage.

Embodiments of the present invention partition the frequency compensated differential stage of a pseudo differential receiver into two halves with each half being biased with separate current sources I/2. The two current sources are then coupled back together with a network comprising a parallel connection of a resistor and a capacitor. At low frequencies the capacitor is a high impedance relative to the resistor and thus the resistor coupling between the two half stages reduces the low frequency gain to less than the gain of directly coupled half stages. Likewise, the capacitor coupling between the two half stages makes the high frequency gain substantially the same as the gain of directly coupled half stages. In this manner, the receiver stage is frequency compensated by reducing the low frequency gain relative to the high frequency gain. This method prevents accentuating high frequency noise components and rather deemphasizes low frequency components that distorts logic state transitions at the receiver side. This embodiment provides frequency compensation but does not provide an easy way to vary the amount of compensation in a particular data input that does not suffer from significant losses.

In another embodiment of the present invention, two differential stages are operated in parallel sharing common load resistors. The first stage is uncompensated with a current source bias that is variable. The second stage is frequency compensated by reducing it low frequency gain. The second stage is also biased with a current source bias that is variable. In this embodiment the sum of the current source currents in each stage, while variable is held constant. If the current in one stage is increased the current in the other stage is reduced by the same amount. Since the two stages share a load resistor, this keeps the operating point the same. However, since each stage is operated a different current level, the dynamic impedance of each stage is different and thus their gains are different. If the current source in the frequency compensated stage is turned fully OFF and the current source in the uncompensated stage is turned fully ON, then the gain will be nominal and uncompensated. Likewise, by turning the frequency compensated stage fully ON and the current source in the uncompensated stage is turned fully OFF, then the gain will be nominal and compensated. Current values in between these extremes will afford varying degrees of compensation.

The current sources may be configured as multiple parallel current sources that are digitally selectable. A register with digital outputs and complement outputs may thus be used to program the current values of the compensated and uncompensated stages. Each data input may then be programmed for an amount of frequency compensation corresponding to the losses expected in the signal trace coupling a data signal to the data receiver.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
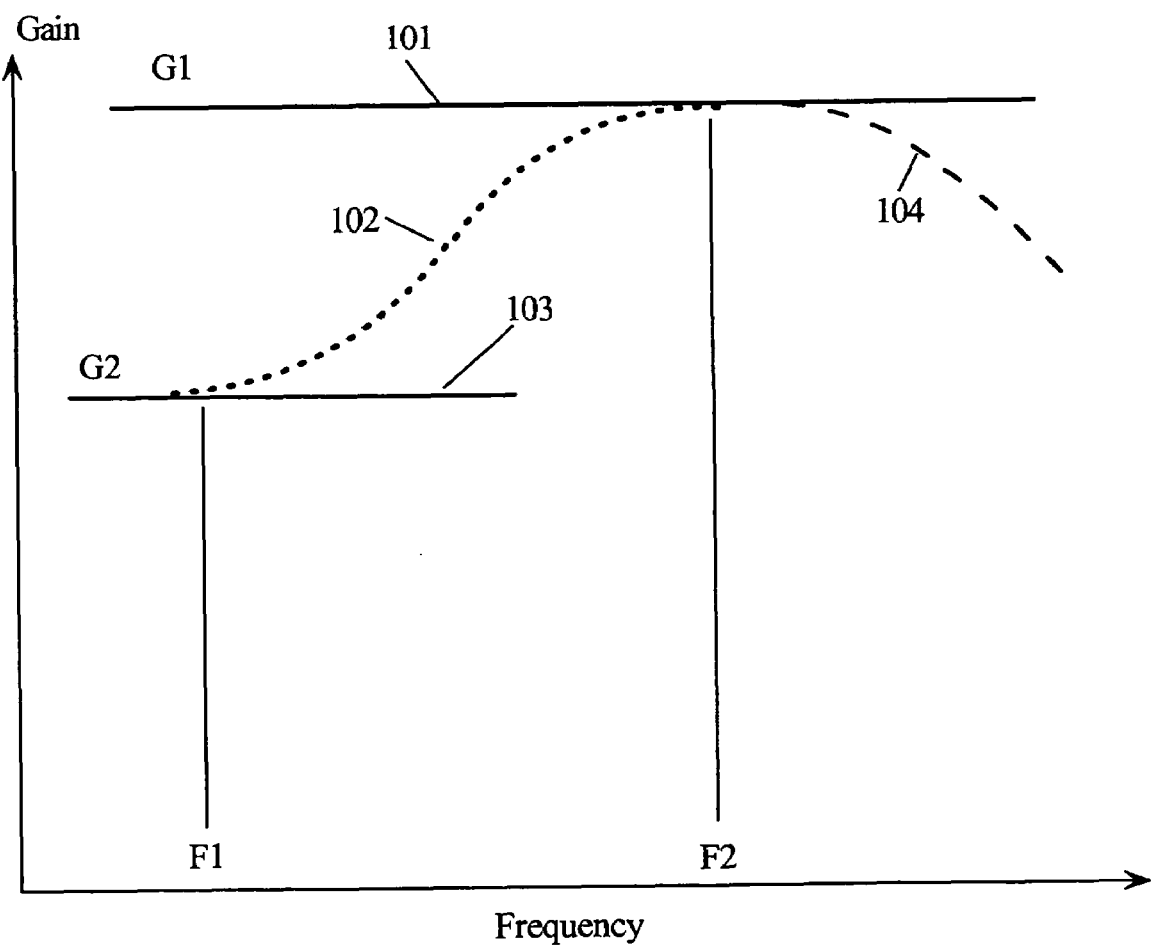
FIG. 1 illustrates three frequency response curves corresponding to a nominal frequency response, an attenuated response and a response that transitions between the nominal and attenuate with increasing frequency.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 6:
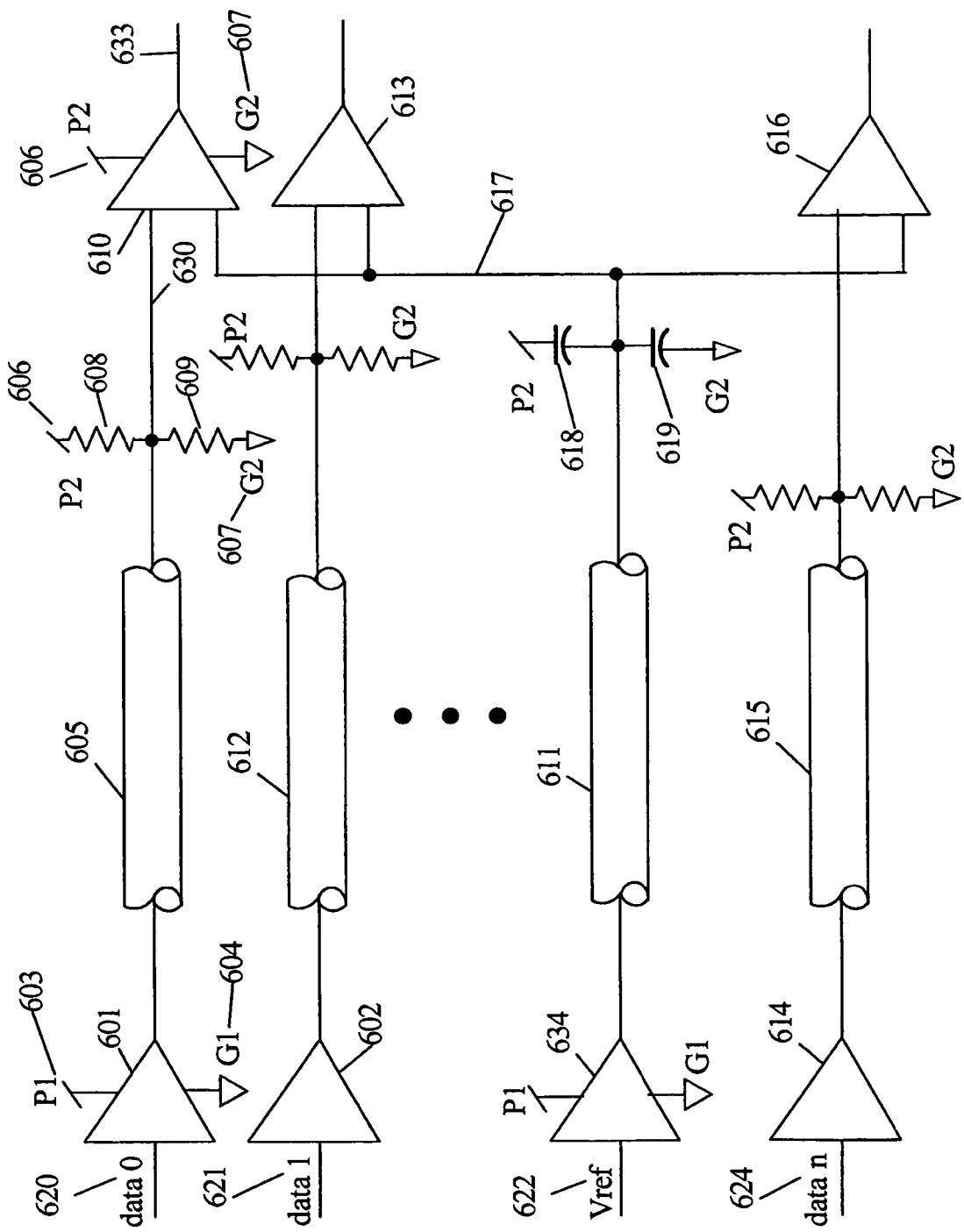
FIG. 6 is a circuit diagram of pseudo differential signaling with driver side reference voltage generation.

FIG. 6 is a circuit diagram of typical pseudo-differential signaling for transmitting data from a driver to a receiver where the reference is generated at the drive side. Drivers 601, 602 and 614 represent three of a number of n drivers sending data (e.g., data 0 620, data 1 621, and data n 624) to receivers 610, 613 and 616, respectively over exemplary transmission lines 605, 612, and 615. Exemplary driver 601 receives data 0 620 and generates an output that swings between power supply rail voltages P1 603 (logic one) and G1 604 (logic zero). When the output of driver 601 is at P1 603, any noise on the power bus is coupled to transmission line 605 along with the logic state of the data signal. Exemplary transmission line 605 is terminated with a voltage divider comprising resistors 608 and 609. Receiver input 630 has a DC bias value determined by the voltage division ratio of resistors 608 and 609 and the voltage between P2 606 and G2 607. Receiver 610 is powered by voltages P2 606 and G2 607 which may have different values from P1 603 and Gi 604 due to distribution losses, noise coupling, and dynamic impedance of the distribution network. Exemplary receiver 610 is typically a voltage comparator or high gain amplifier that amplifies the difference between a signal at input 630 and a reference voltage at node 617 to generate an output 633. Voltage reference Vref 622 may be buffered with amplifier 634 and distributed via line 611 to the exemplary receivers 610, 613 and 616. While Vref 622 may be a stable reference, it normally may not track variations in power supply P1 603. Likewise, the noise on line 611 coupled to node 617 will likely be different than the noise coupled to a data line (e.g., 605). While capacitors 618 and 619 may reduce high frequency noise on node 617, variations in power supply voltage P2 606 are not tightly coupled to node 617. The variations in power supply voltages P1 603 and P2 606 are coupled to the data inputs (e.g., 630) differently than variations are coupled to node 617. Likewise, power supply noise is coupled to the data inputs differently and thus noise and power supply variations may not manifest themselves as common mode signals that may be reduced by the common mode rejection capabilities of the differential receivers (e.g., 610, 613, and 616). Receivers 610, 613, and 616 may employ frequency compensation according to embodiments of the present invention.

Figure 7:
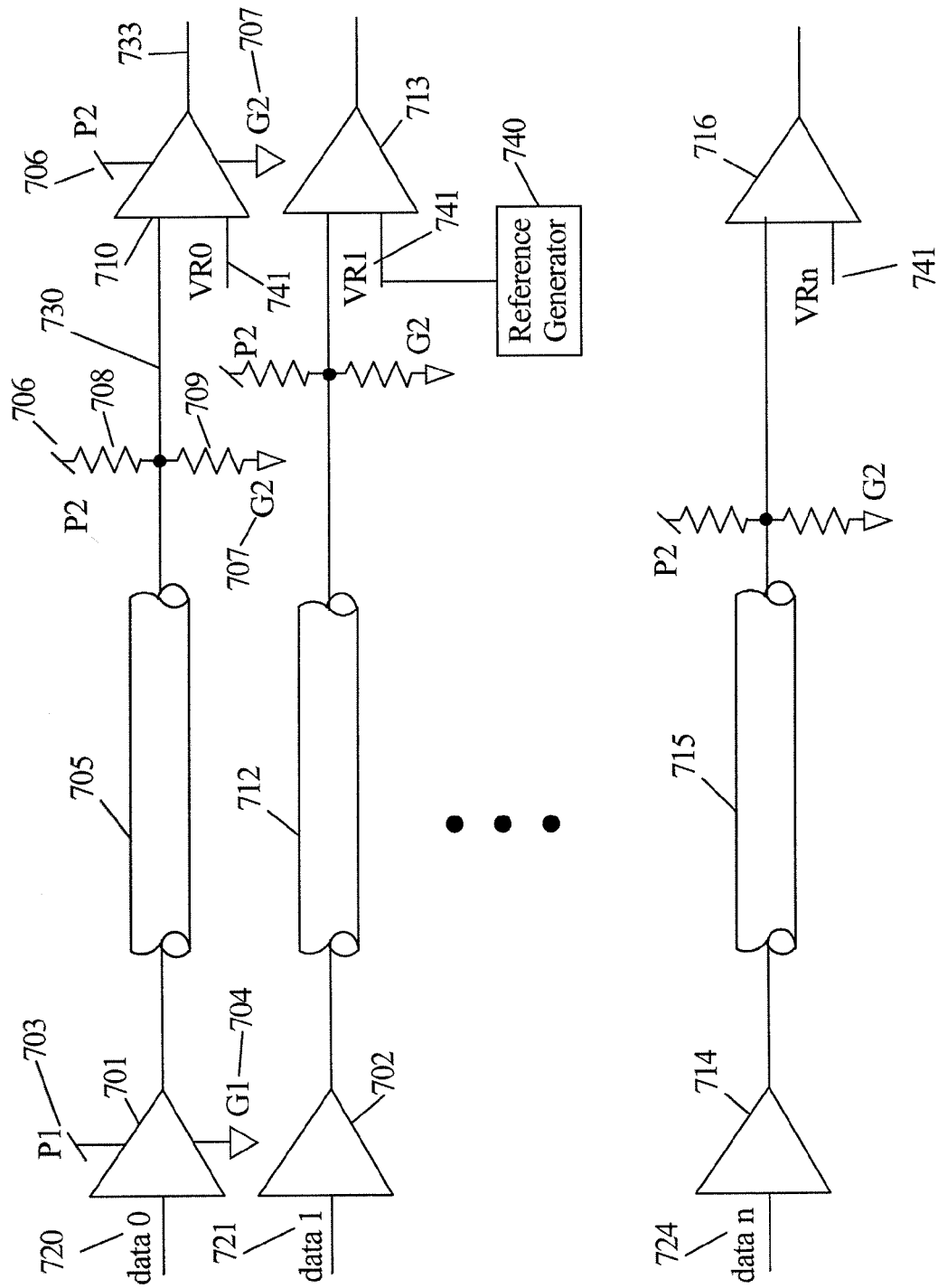
FIG. 7 is a circuit diagram of pseudo differential signaling with receiver side reference voltage generation.

FIG. 7 is a circuit diagram of typical pseudo-differential signaling for transmitting data from a driver to a receiver where the reference is generated at the receiver side. Exemplary reference generator (RG) 740 may be used to generate a single reference (e.g., VR1 741) for a receiver (e.g., 713) or multiple receivers. Operation of the circuitry is similar to pseudo-differential signaling of FIG. 6. Drivers 701, 702 and 714 represent three of a number of n drivers sending data (e.g., data 0 720, data 1 721, and data n 724) to receivers 710, 713 and 716, respectively over exemplary transmission lines 705, 712, and 715. Exemplary driver 701 receives data 0 720 and generates an output that swings between power supply rail voltages P1 703 (logic one) and G1 704 (logic zero). When the output of driver 701 is at P1 703, any noise on the power bus is coupled to transmission line 705 along with the logic state of the data signal. Exemplary transmission line 705 is terminated with a voltage divider comprising resistors 708 and 709. Receiver input 730 has a DC bias value determined by the voltage division ratio of resistors 708 and 709 and the voltage between P2 706 and G2 707. Receiver 710 is powered by voltages P2 706 and G2 707 which may have different values from P1 703 and G1 704 due to distribution losses, noise coupling, and dynamic impedance of the distribution network. Exemplary receiver 710 is typically a voltage comparator or high gain amplifier that amplifies the difference between a signal at input 730 and a reference voltage 741 to generate an output 733. In this circuitry, driver side noise will not be reduced by common mode rejection as the reference voltage (e.g., VRO 741) does not contain driver side noise but rather reflects noise of the receiver side. Receivers 710, 713, and 716 may employ frequency compensation according to embodiments of the present invention. Other methods for generating driver or receiver side reference voltages to be used in frequency compensated pseudo differential signaling are considered within the scope of the present invention.

FIG. 1 illustrates three frequency response curves plotting gain as a function of frequency for pseudo differential receivers. Gain 101 is the maximum gain of the differential amplifier receiver when the frequency compensation network (RLF 310 and CHF 311 in FIG. 3A) does not add significant attenuation. Curve 104 is the natural roll-off of the devices making up the differential amplifier (e.g., NFETs 307 and 309). Gain 103 is the minimum gain attributed to attenuation by the compensation network. Curve 102 is the composite gain of the differential amplifier from frequencies less than F1 through frequencies above F2 according to embodiments of the present invention.

Figure 2:
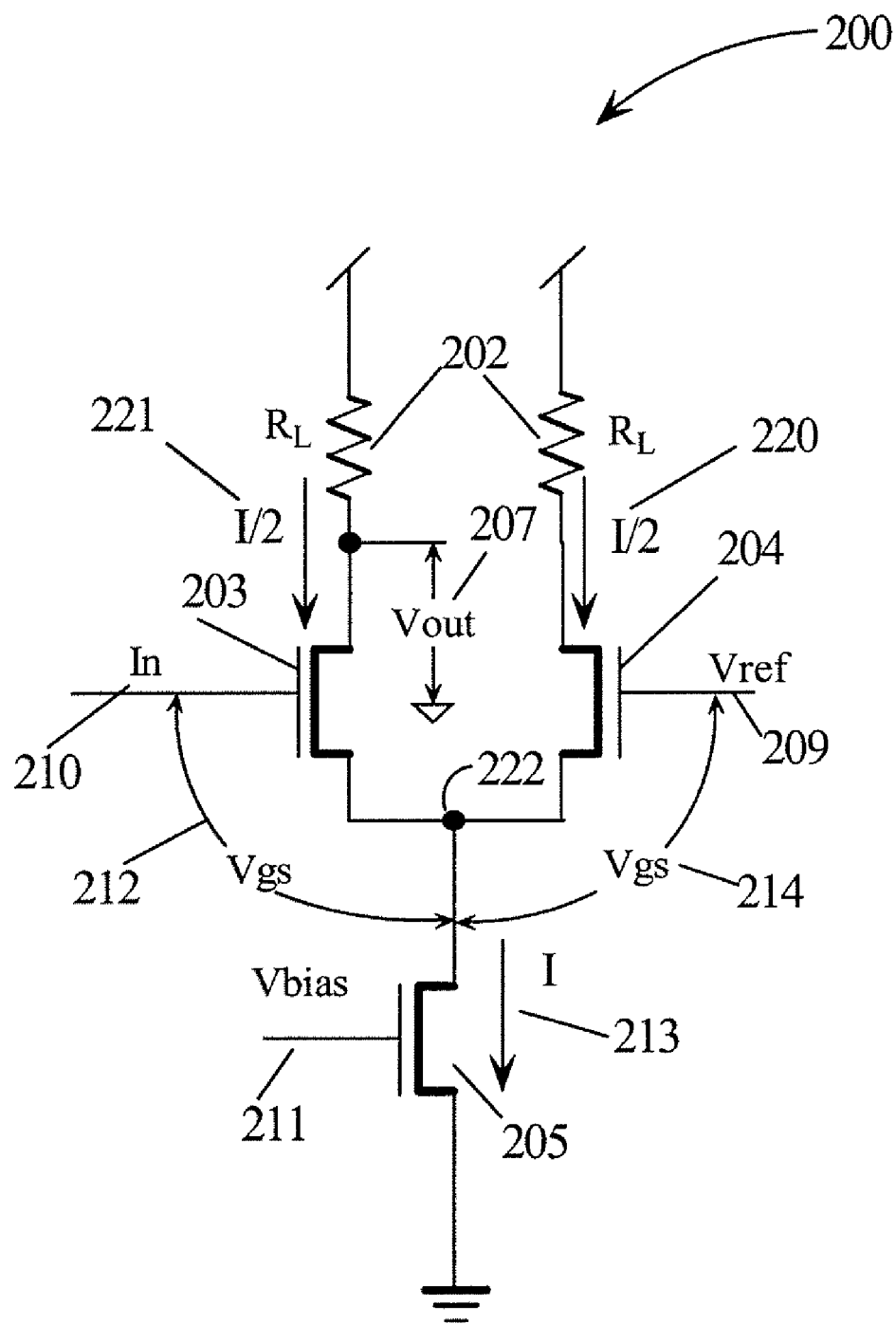
FIG. 2 is a standard common source FET current source biased differential amplifier.

FIG. 2 is a circuit diagram of a differential stage 200 for amplifying the difference between and input IN 210 and a reference voltage VR 209 and generating output Vout 207 across a load resistor 202. The differential stage 200 is biased with a current source comprising NFET 205. When a bias voltage Vb 211 is applied to the gate of NFET 205, the resulting drain current 213 is relatively constant and independent of the voltage on node 222. The drain current 213 divides between NFET 203 and 204 based on the difference between the gate-to source voltages Vgs 212 and Vgs 214. If TN 210 and VR 209 are equal, then current 220 and 221 are equal and their sum is equal to current 213. It may be shown that the voltage gain of differential stage 200 is dependent on the load resistor RL 202 and the dynamic impedance of the NFETS 203 and 204 which in-turn is a function of the bias current, therefore, the stage gain may be varied by varying the bias current 213.

Figure 3:
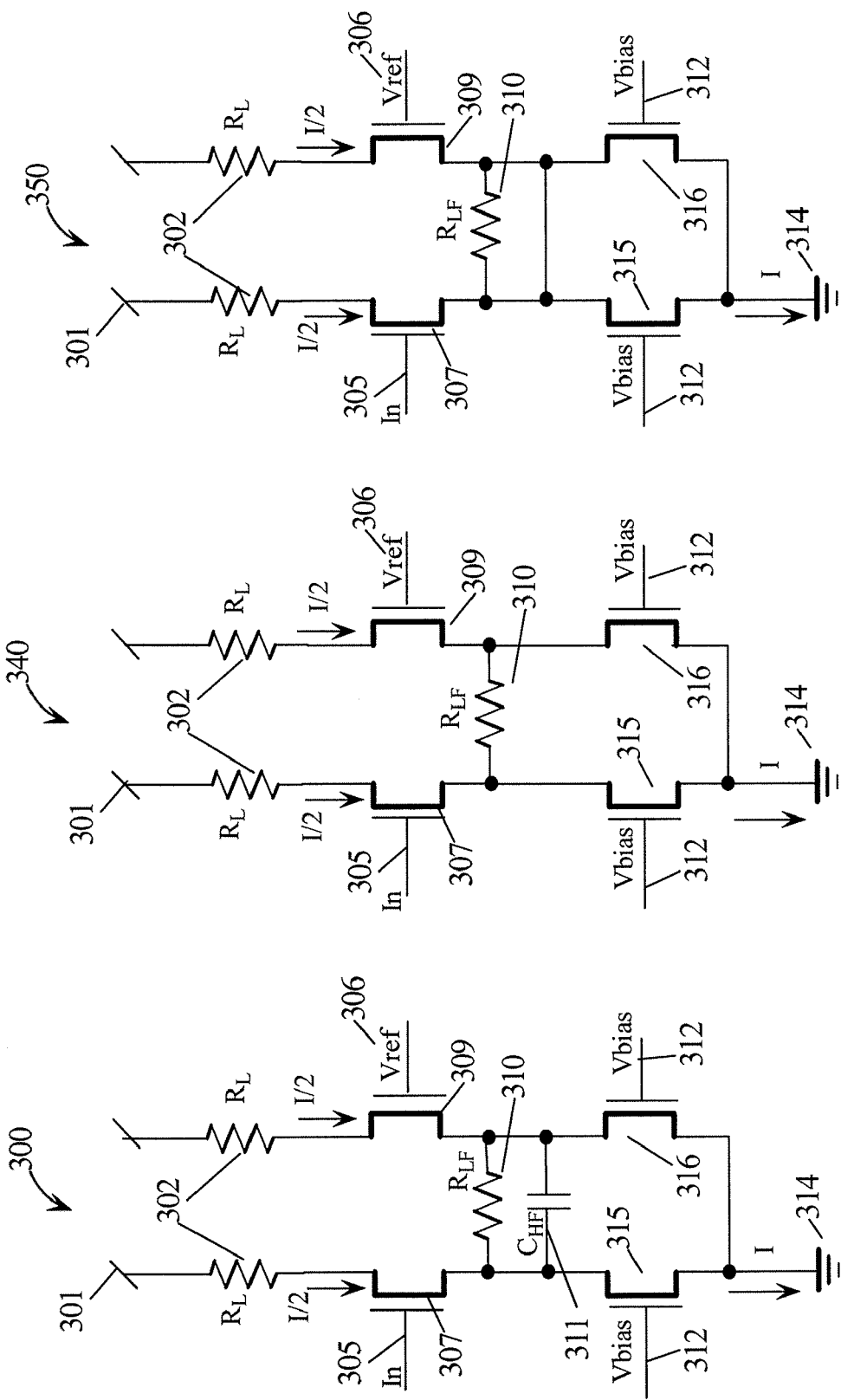
FIG. 3A is a frequency compensated differential amplifier.
FIG. 3B is the equivalent circuit for the differential amplifier of FIG. 3A at low frequencies.
FIG. 3C is the equivalent circuit for the differential amplifier of FIG. 3A at high frequencies.

FIG. 3B is a circuit diagram of a differential stage 340 powered by voltage potentials 301 and 314 and comprising NFETS 307 and 309 with corresponding equal load resistors RL 302. NFETS 307 and 309 are biased with independent current sources NFET 315 and 316. The two current sources are coupled with resistor RLF 310. Using a common Vbias 312 for both current sources, NFET 307 and NFET 309 are biased at the same current. Without resistor RLF 310 the two halves of the amplifier stage would be independent. The magnitude of RLF 310 determines how much gain the stage amplifies a signal at IN 305. The response of differential stage 304 would correspond to curve 103 in FIG. 1.

FIG. 3C is a circuit diagram of the differential stage 350 comprising NFETS 307 and 309 with corresponding equal load resistors RL 302. NFETS 307 and 309 are biased with independent current sources NFET 315 and 316. The two current sources are direct coupled. Again using a common Vbias 312, both current sources NFET 307 and NFET 309 are biased at the same current. This configuration is like FIG. 2, except the current source comprises two FETS 315 and 316. The response of differential stage 350 would correspond to curve 101 in FIG. 1.

FIG. 3A is a circuit diagram of differential stage 300 wherein the features of stages 350 and 340 are incorporated into one stage except the direct coupling between the sources of NFETS 307 and 309 is replaced with a capacitance CHF 311. In this configuration, the differential stage 300 has a frequency response curve that corresponds to curve 103 at low frequencies wherein the impedance of CHF 311 is much greater than RLF 310. Likewise, at high frequencies, the impedance of CHF 311 is much smaller than RLF 310 and the combined circuit has a frequency response curve that corresponds to curve 101. Between these extremes, the frequency response curve follows curve 102. By suppressing the low frequency gain with resistor RLF 310 and bypassing RLF 310 with capacitor CHF 311, a peaking frequency response is realized. The differential stage 301 allows a single ended input IN 305 to be amplified relative to a reference voltage VR 306 with the high frequency signal components being amplified with a gain greater than low frequency signal components. If the bias voltage Vbias 312 is varied, then the overall gain of the stage is varied while maintaining a difference between the low frequency and high frequency gains.

If the differential amplifier 300 configuration of FIG. 3A is used as a pseudo differential receiver for a transmission line, then frequency compensation is always present even though the magnitude of the gain may be modified by varying bias voltages Vbias 312. In some applications various data transmission lines have significant high frequency losses and others have minimal losses. When a transmission line has minimum losses, it may be desirable to not provide frequency compensation by reducing the low frequency gain relative to the high frequency gain. Using the embodiment of FIG. 3A would not afford enough flexibility in selecting or de-selecting frequency compensation for pseudo differential signaling.

Figure 4:
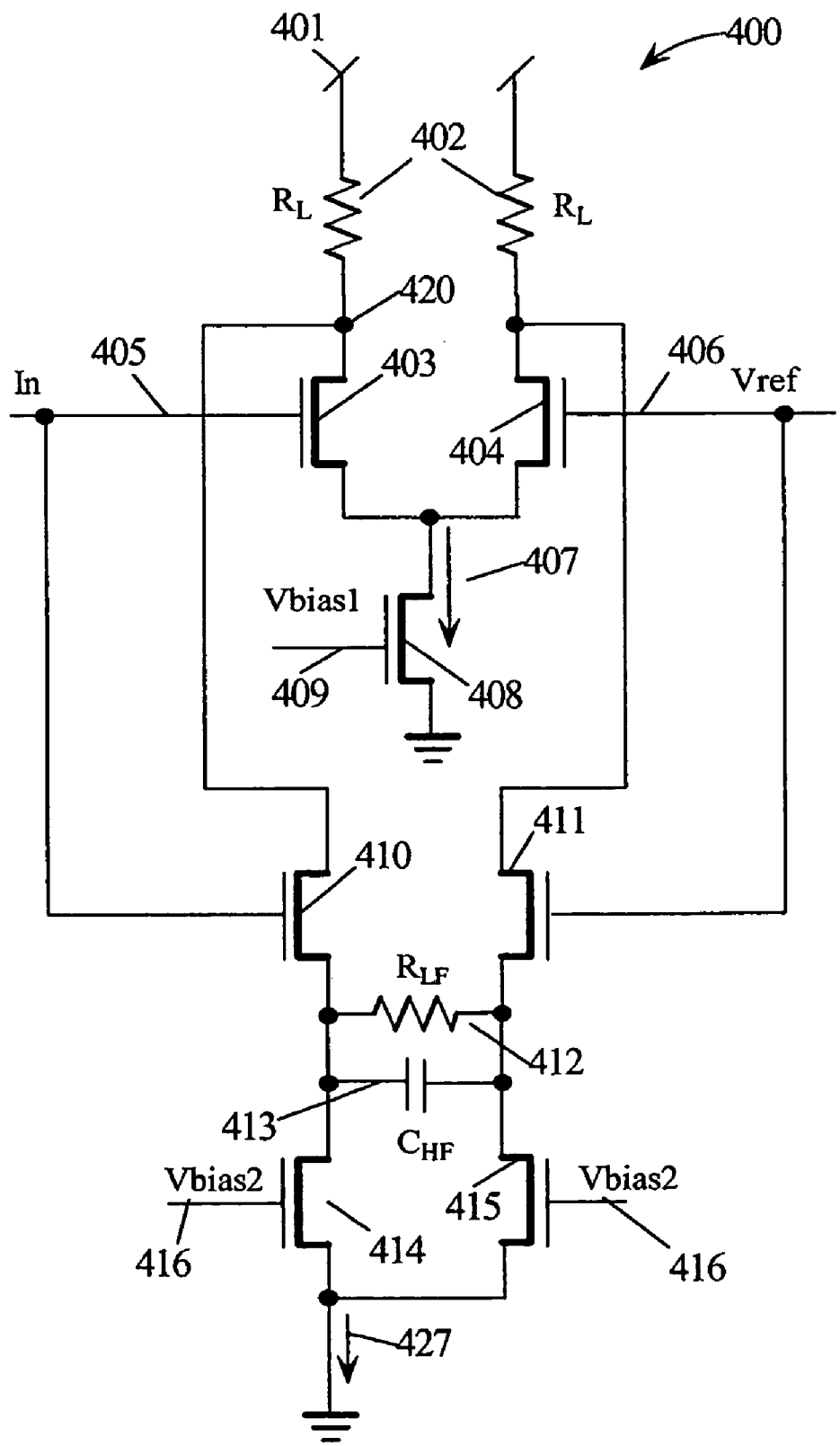
FIG. 4 is a frequency compensated receiver according to embodiments of the present invention.

FIG. 4 is a circuit diagram of a pseudo differential receiver (PDR) 400 according to an embodiment of the present invention with control of frequency compensation from full frequency compensation to no frequency compensation. PDR 400 is powered by power supply voltage 401 and comprises a parallel combination of a non-frequency compensated PDR and a frequency compensated PDR sharing common load resistors RL 402. The non-frequency compensated stage comprises NFETS 403 and 404 biased with current source NFET 408. Vbias1 409 sets the bias current 407 in NFET 408. The frequency compensated stage comprises NFETS 410 and 411 biased by current source NFETS 414 and 415, wherein Vbias2 416 sets the total bias current 427. The two current sources (NFETS 414 and 415) are coupled with resistor RLF 412 and CHF 413. The frequency compensated stage operates as the PDR 300 explained relative to FIG. 3A except PDR 300 does not share a load resistor with a non-frequency compensated stage. IF NFET 408 is turned OFF, then the voltage at node 420 is determined entirely by the response of the frequency compensated stage. Likewise, if NFETS 414 and 415 are turned OFF, then the voltage at node 420 is determined entirely by the response of the non-frequency compensated stage. By keeping the sum of the currents 407 and 427 equal, then any combination of compensated and non-compensated response is possible by mutual opposite modulations of the current levels in NFET 408 and NFETS 414 and 415.

Figure 5:
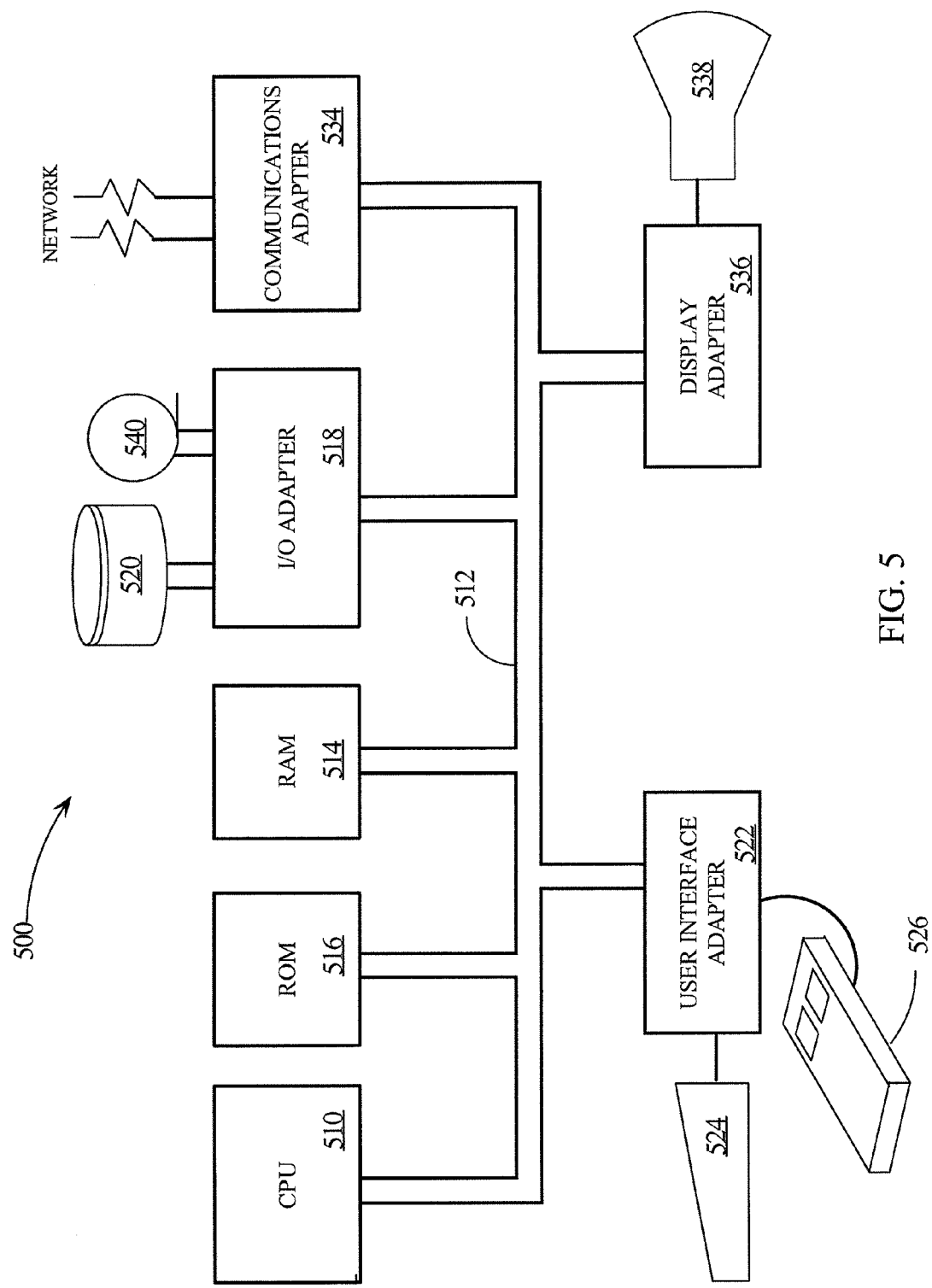
FIG. 5 is a block diagram of a data processing system suitable for practicing embodiments of the present invention.

FIG. 5 is a high level functional block diagram of a representative data processing system 500 suitable for practicing the principles of the present invention. Data processing system 500 includes a central processing system (CPU) 510 operating in conjunction with a system bus 512. System bus 512 operates in accordance with a standard bus protocol, such as the ISA protocol, compatible with CPU 510. CPU 510 operates in conjunction with electronically erasable programmable read-only memory (EEPROM) 516 and random access memory (RAM) 514. Among other things, EEPROM 516 supports storage of the Basic Input Output System (BIOS) data and recovery code. RAM 514 includes, DRAM (Dynamic Random Access Memory) system memory and SRAM (Static Random Access Memory) external cache. I/O Adapter 518 allows for an interconnection between the devices on system bus 512 and external peripherals, such as mass storage devices (e.g., a hard drive, floppy drive or CD/ROM drive), or a printer 540. A peripheral device 520 is, for example, coupled to a peripheral control interface (PCI) bus, and I/O adapter 518 therefore may be a PCI bus bridge. User interface adapter 522 couples various user input devices, such as a keyboard 524 or mouse 526 to the processing devices on bus 512. Display 538 which may be, for example, a cathode ray tube (CRT), liquid crystal display (LCD) or similar conventional display units. Display adapter 536 may include, among other things, a conventional display controller and frame buffer memory. Data processing system 500 may be selectively coupled to a computer or telecommunications network 541 through communications adapter 534. Communications adapter 534 may include, for example, a modem for connection to a telecom network and/or hardware and software for connecting to a computer network such as a local area network (LAN) or a wide area network (WAN). CPU 510 and other components of data processing system 500 may contain logic circuitry in two or more integrated circuit chips that are separated by a significant distance relative to their communication frequency such that pseudo-differential signaling is used to improve reliability. The power supply voltages of the two or more integrated circuits may undergo different unregulated variations wherein communication signal detection is improved by employing derived reference circuits according to embodiments of the present invention.

Although the present invention and its advantages have been described in detail, it should be understood that various changes, substitutions and alterations can be made herein without departing from the spirit and scope of the invention as defined by the appended claims.

What is claimed is:

1. A receiver circuit for a logic signal transmitted from a driver over a transmission line comprising:

a differential amplifier having a first input coupled to an output of the transmission line, a second input coupled to a direct current (DC) reference voltage, and a receiver output generating a detected output across a load resistor as the amplified difference between a signal received on the first input and the DC reference voltage;

a compensation network coupled to the differential amplifier for setting a first gain of the amplifier at a maximum value for frequencies greater than a first frequency, attenuating the gain of the amplifier to a minimum value at frequencies below a second frequency substantially lower than the first frequency and setting the gain of the amplifier to transition between the minimum and maximum values at frequencies between the first and second frequencies.

2. The receiver circuit of claim 1, wherein the differential amplifier comprises a first differential stage having a first stage input coupled to the first input, a second stage input coupled to the second input and a stage output coupled to the load resistor thereby developing a first portion of the detected output as a first current through the load resistor generated as a difference between the signal received on the first input and the DC reference voltage amplified by a first value of the first gain, wherein the first value is substantially constant from the first frequency to the second frequency.

3. The receiver circuit of claim 2, wherein the differential amplifier further comprises a second differential stage having a third stage input coupled to the first input, a fourth stage input coupled to the second input, and a second stage output coupled to the load resistor thereby developing a second portion of the detected output as a second current through the load resistor generated as a difference between the signal received on the first input and the DC reference voltage amplified by a second gain, wherein the second gain has a second value for frequencies greater than the first frequency, a third value lower than the second value at frequencies equal to and below the second frequency and intermediate values between the second and third values for frequencies between the first and second frequencies.

4. The receiver circuit of claim 3, wherein the compensation network is coupled to the second differential stage thereby setting the second, third and intermediate values of the second gain.

5. The receiver circuit of claim 4, wherein the first differential stage is biased by a first current source with a plurality of selectable first current values.

6. The receiver circuit of claim 5, wherein the second differential stage is biased by a second current source with a plurality of selectable second current values.

7. The receiver circuit of claim 6, wherein the sum of a selected first current value and a selected second current value is a constant current value.

8. The receiver circuit of claim 7, wherein an amount of frequency compensation for the receiver circuit is set by the proportion of the constant current value allotted to the second current value.

9. The receiver circuit of claim 6, wherein the first differential stage comprises:
a first amplifying device having an input coupled to the first input, an output coupled to the load resistor and a bias terminal coupled to the first current source; and
a second amplifying device having an input coupled to the second input, an output coupled to a first power supply voltage potential, and a bias terminal coupled to the first current source.

10. The receiver circuit of claim 9, wherein the second current source comprises a first current source stage and a second current source stage each supplying substantially equal portions of the second current values.

11. The receiver circuit of claim 10, wherein the second differential stage comprises:
a first amplifying device having an input coupled to the first input, an output coupled to the load resistor and a bias terminal coupled to a coupled to the first current source stage; and
a second amplifying device having an input coupled to the second input, an output coupled to the first power supply voltage potential and a bias terminal coupled to the second current source stage, wherein the compensation network is coupled between the bias terminal of the first amplifying device and the bias terminal of the second amplifying device of the second differential stage.

12. The receiver circuit of claim 9, wherein the first amplifying device is an N channel field effect transistor (NFET) with a gate electrode coupled to the first input, a drain electrode coupled to the load resistor and a source electrode coupled to the first current source and the second amplifying device is an NFET with a gate electrode coupled to the second input, a drain electrode coupled to the first voltage potential of the power supply and a source electrode coupled to the first current source.

13. The receiver circuit of claim 11, wherein the first amplifying device is an N channel field effect transistor (NFET) with a gate electrode coupled to the first input, a drain electrode coupled to the load resistor and a source electrode coupled to the first current source stage and the second amplifying device is an NFET with a gate electrode coupled to the second input, a drain electrode coupled to the first voltage potential of the power supply and a source electrode coupled to the second current source stage.

14. The receiver circuit of claim 12, wherein the first current source is a NFET having a gate electrode coupled to a first bias voltage potential, drain electrode coupled to source electrodes of the first and second amplifying devices, and a source electrode coupled to a second voltage potential of the power supply.

15. The receiver circuit of claim 13, wherein the first current source stage is a NFET having a gate electrode coupled to a second bias voltage potential, a drain electrode coupled to source electrode of the first amplifying device, and a source electrode coupled to a second voltage potential of the power supply and the second current source stage is a NFBT having a gate electrode coupled to the second bias voltage potential, a drain electrode coupled to source electrode of the second amplifying device, and a source electrode coupled to a second voltage potential of the power supply.

16. An integrated circuit (IC) receiving a multiplicity of logic signals transmitted over transmission lines with varying degrees of losses comprising:
a receiver circuit for each of the multiplicity of logic signals each receiver circuit configured as a differential amplifier having a first input coupled to an output of the transmission line, a second input coupled to a direct current (DC) reference voltage and a receiver output generating a detected output across a load resistor as the amplified difference between a signal received on the first input and the DC reference voltage, wherein a compensation network is coupled to the differential amplifier for setting a first gain of the differential amplifier at a maximum value for frequencies greater than a first frequency, attenuating the gain of the amplifier to a minimum value at frequencies below a second frequency substantially lower than the first frequency and setting the gain of the amplifier to transition between the minimum and maximum values at frequencies between the first and second frequencies.

17. The IC of claim 16, wherein the differential amplifier comprises a first differential stage having a first stage input coupled to the first input, a second stage input coupled to the second input and a stage output coupled to the load resistor thereby developing a first portion of the detected output as a first current through the load resistor generated as a difference between the signal received on the first input and the DC reference voltage amplified by a first value of the first gain, wherein the first value is substantially constant from the first frequency to the second frequency.

18. The IC of claim 17, wherein the differential amplifier further comprises a second differential stage having a third stage input coupled to the first input, a fourth stage input coupled to the second input, and a second stage output coupled to the load resistor thereby developing a second portion of the detected output as a second current through the load resistor generated as a difference between the signal received on the first input and the DC reference voltage amplified by a second gain, wherein the second gain has a second value for frequencies greater than the first frequency, a third value lower than the second value at frequencies equal to and below the second frequency and intermediate values between the second and third values for frequencies between the first and second frequencies.

19. The IC of claim 18, wherein the compensation network is coupled to the second differential stage thereby setting the second, third and intermediate values of the second gain.

20. The IC of claim 19, wherein the first differential stage is biased by a first current source with a plurality of selectable first current values, the second differential stage is biased by a second current source with a plurality of selectable second current values and the sum of a selected first current value and a selected second current value is a constant current value.

* * * * *